United States Patent [19]

Bruchez

[11] 3,886,004

[45] May 27, 1975

[54] METHOD OF MAKING SILICON SEMICONDUCTOR DEVICES UTILIZING ENHANCED THERMAL OXIDATION

[75] Inventor: Jeffrey Alan Bruchez, Hazel Grove, England

[73] Assignee: Ferranti Limited, Hollinwood, Lancashire, England.

[22] Filed: Feb. 27, 1973

[21] Appl. No.: 336,375

[52] U.S. Cl. .................. 148/187; 29/578; 117/212; 117/213; 148/175; 156/17; 357/34; 357/48

[51] Int. Cl. .......................... H01l 7/36; H01l 27/04

[58] Field of Search ........... 148/175, 187; 117/212, 117/213; 156/17; 29/578; 317/235 E, 235 AG

[56] References Cited

UNITED STATES PATENTS

| | | | |
|---|---|---|---|
| 3,398,029 | 8/1968 | Yasufuku et al. | 148/187 X |
| 3,404,451 | 10/1968 | So | 29/578 X |
| 3,418,180 | 12/1968 | Ku | 148/187 |
| 3,575,741 | 4/1971 | Murphy | 148/175 |
| 3,717,516 | 2/1973 | Hatcher et al. | 148/187 |
| 3,755,014 | 8/1973 | Appels et al. | 148/187 |
| 3,756,876 | 9/1973 | Brown et al. | 148/187 X |

OTHER PUBLICATIONS

Barson et al., "Planar Transistor – Diffusion Thermal Oxidation" I.B.M. Tech. Discl. Bull., Vol. 9, No. 11, April 1967, p. 1650.

Deal et al., "Recent Advances – Metal–Oxide–Silicon System" Trans. Metall. Soc. of AIME, V. 233, Mar 1965, pp. 524–529.

*Primary Examiner*—L. Dewayne Rutledge
*Assistant Examiner*—W. G. Saba
*Attorney, Agent, or Firm*—Cameron, Kerkam, Sutton, Stowell & Stowell

[57] ABSTRACT

A silicon oxide layer is formed on a phosphorus doped surface region of a silicon semiconductor body by steam treatment, there being an enhanced growth rate of the silicon oxide on the phosphorus doped region enabling, for example, the provision of a low temperature steam treatment, and/or the production, possibly within an aperture in an already provided silicon oxide layer less than 3000A thick, of a thin silicon oxide layer, so that impurity concentration gradients within the semiconductor body are not caused to change by a significant extent and the surface concentration of phosphorus within the region is not significantly depleted.

8 Claims, 4 Drawing Figures

Figure 1:
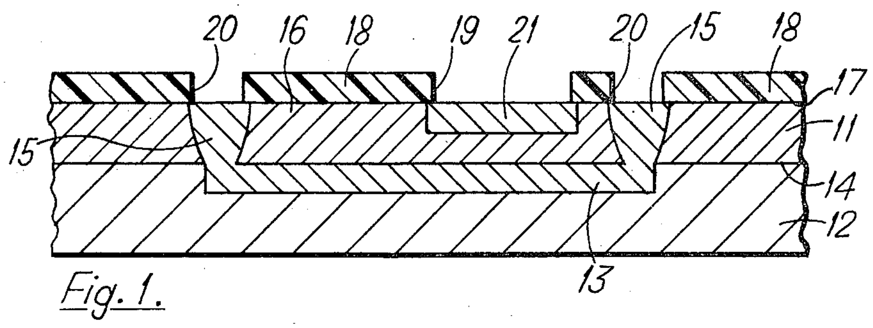

METHOD OF MAKING SILICON SEMICONDUCTOR DEVICES UTILIZING ENHANCED THERMAL OXIDATION

This invention relates to the manufacture of silicon semiconductor devices, and in particular to the provision of layers of silicon oxide on parts of silicon semiconductor bodies in which the devices are provided.

It is known to form silicon oxide layers on silicon semiconductor bodies by subjecting the bodies to steam. However, such layers have been used only as diffusion-resistant layers, and have never been formed for passivation purposes after the diffusion steps by which the semiconductor devices are provided in the bodies. Previous methods of forming silicon oxide layers of required thicknesses by using steam have caused the impurity concentration gradients within the bodies to change by a significant extent; and some impurities such as boron are transferred from the surface portions of the semiconductor bodies into silicon oxide layers formed in this way.

It is an object of the present invention to provide a novel and advantageous method of forming a layer of silicon oxide on at least part of a silicon semiconductor body.

According to the present invention an improved method of manufacturing a semiconductor device of the collector-isolation-diffusion type in a silicon semiconductor body includes the steps of selectively doping with phosphorus a region comprising part of a surface portion of the semiconductor body, and subjecting the phosphorus doped region to steam to form on the region a layer of silicon oxide.

In forming such a silicon oxide layer there is an enhanced growth rate compared with the formation of silicon oxide layers by steam treatment of regions doped with other impurities, and the surface concentration of phosphorus is not significantly depleted because the phosphorus atoms prefer to segregate into the silicon body rather than the silicon oxide layer.

If a thin silicon oxide layer is required to be provided by the steam treatment it may be provided without there being a consequent significant change in the impurity concentration gradients within the semiconductor body.

The silicon oxide layer, formed by the steam treatment of part of the semiconductor body, may be formed within an aperture in a thin silicon oxide layer already provided on the semiconductor body. The silicon oxide layer formed by the steam treatment will be formed at a substantially greater rate than the rate the thickness of the original silicon oxide layer is increased in this process step. If the thickness of the thin silicon oxide layer already provided on the semiconductor body is less than 3000A, it is possible to provide on the surface of the phosphorus doped region, by the steam treatment of the surface, either a silicon oxide layer with a thickness substantially the same as the original silicon oxide layer, and/or it is possible to arrange that the thickness of the silicon oxide layer formed by the steam treatment is such that in a subsequent etching step apertures are etched simultaneously, and in the same time, through both the silicon oxide layer already provided on the semiconductor body and the silicon oxide layer formed by the steam treatment.

The growth rate of the silicon oxide layer formed on the phosphorus doped layer by steam treatment is proportional both to the temperature at which the steam treatment is performed, and to the phosphorus concentration in the surface portions of the region. Hence, the formation of the silicon oxide layer, of any required thickness, by the steam treatment may be for passivation purposes, and is provided after the final diffusion step in the manufacture of the semiconductor device without there being a significant change in the impurity concentration gradients within the semiconductor body. However, it is desirable that the silicon oxide layer is formed by steam treatment at as low a temperature as possible, and the temperature of the steam treatment may be in the range 700° C to 1100° C. In such a case, in order to obtain a growth rate of a silicon oxide layer provided by the steam treatment substantially greater than the rate the thickness of a silicon oxide layer already provided on the semiconductor body is increased, it is necessary that the surface portions of the phosphorus doped region are heavily doped. The final diffusion step may be the diffusion of phosphorus into the semiconductor body to form the region, a silicon oxide layer already provided on the semiconductor body containing phosphorus diffused into it during this diffusion step and so is suitable for a passivating layer on the completed device.

The device may comprise an N-P-N transistor of the so-called collector-diffusion-isolation construction, the silicon oxide layer formed by the steam treatment being provided on the emitter region which is heavily doped with phosphorus in a final selective diffusion step. The CDI process is a known process for fabricating semiconductor integrated circuit devices and reference may be had to U.S. Pat. No. 3,575,741 which describes a method of producing a junction isolated semiconductor integrated circuit structure by the CDI process. Alternatively, the device may be other than a transistor, but has a construction closely resembling the construction of a collector-diffusion-isolation transistor. An N-P-N collector-diffusion-isolation transistor is provided in a silicon semiconductor body formed by an epitaxial layer initially wholly of P conductivity type on a substrate of the same conductivity type, the transistor having a collector comprising an N+ type isolation barrier for the transistor and an N+ type buried layer at the interface between the epitaxial layer and the substrate, the isolation barrier extending through the epitaxial layer into contact with the buried layer, the base of the transistor being defined within the epitaxial layer by the collector, and the emitter region being provided within the base.

According to another aspect the present invention comprises a silicon semiconductor device provided by a method as referred to above.

The present invention will now be described by way of example with reference to the accompanying drawings, each of which comprises a section through a silicon semiconductor body at successive different stages in the manufacture of a semiconductor device in the body. FIGS. 1–4 are cross-sectional views of the same semiconductor body substantially as it appears following successive fabrication steps leading to the formation of a contact structure.

Figure 4:
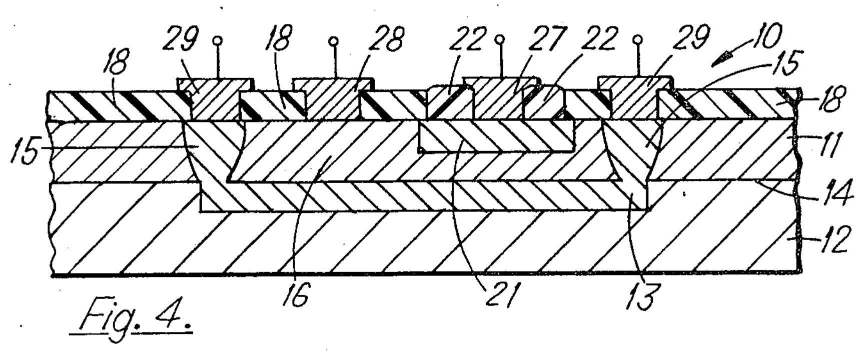

The illustrated method is for the manufacture of a transistor 10, the completed transistor 10 having the so-called collector-diffusion-isolation construction, and being shown in FIG. 4. In the manufacture of the transistor 10, and as shown in FIG. 1, a silicon semiconductor body is formed with an epitaxial layer 11 initially wholly of P-type on a high resistivity P-type substrate 12. A buried N+ type layer 13 is provided at a portion of the interface 14 between the epitaxial layer 11 and substrate 12. The buried N+ type layer 13 comprises part of the collector of the transistor, the remainder of the collector comprising an N+ type isolation barrier 15 for the transistor 10, the isolation barrier 15 extending through the epitaxial layer 11 into contact with the buried N+ type layer 13. The collector 13, 15 defines a P type base 16 in the epitaxial layer 11. Then the whole of the exposed surface 17 of the epitaxial layer 11 is doped in a non-selective diffusion step which is not illustrated. In this non-selective diffusion step the surface portions of the P type regions are made heavily doped P+ type, and the surface portions of the collector are changed from being heavily doped N+ type. During the non-selective diffusion step, or subsequently thereto, an original, thin, silicon oxide layer 18 2000 A thick, is formed on the whole of the surface 17. An aperture 19 is etched through the original silicon oxide layer 18 to expose a part of the base 16, and simultaneously another aperture 20 is etched through the layer 18 to expose part of the isolation barrier 15 of the collector. Phosphorus is then diffused into the silicon body through the aperture 19 and 20 in the original silicon oxide layer 18, simultaneously reforming the surface portions of the collector as heavily doped N+ type, and providing a heavily doped N+ type emitter 21 within the base 16. The original silicon oxide layer 18 has phosphorus diffused into it during the diffusion step, and so is suitable as a passivating layer on the completed device.

Figure 2:
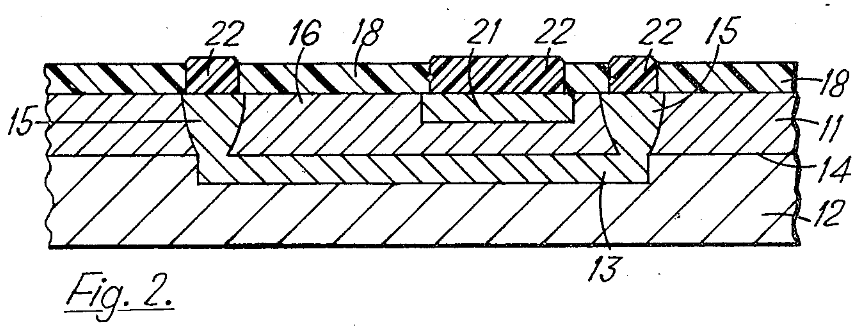

In order to provide a satisfactory passivating layer on the emitter 21, and as shown in FIG. 2, the exposed surfaces of the N+ type phosphorus doped regions 15 and 21 are subjected to steam at the low temperature of 900° C. The impurity concentration gradients within the semiconductor body are not significantly changed by this steam treatment after the final diffusion step.

In this process step there is provided the desired passivating silicon oxide layer 22 on the emitter 21. The silicon oxide layer 22, formed by the steam treatment, is formed at a rate substantially greater than the rate the thickness of the original silicon oxide layer is increased in this process step. Thus, as shown in FIG. 2, the silicon oxide layer 22 may be made of substantially the same thickness as the original silicon oxide layer 18 because the original silicon oxide layer is less than 3000 A thick. The growth rate of a silicon oxide layer inevitably reduces as the thickness of the silicon oxide layer increases, if there are otherwise identical process conditions throughout the formation or thickening of the silicon oxide layer. During the final phosphorus diffusion step a very thin layer of silicon oxide will be formed within the apertures 19 and 20 in the original silicon oxide layer 18, however, this does not prevent the formation of the silicon oxide layer 22 by the steam treatment and so that the layer 22 is of substantially the same thickness as the layer 18.

Figure 3:
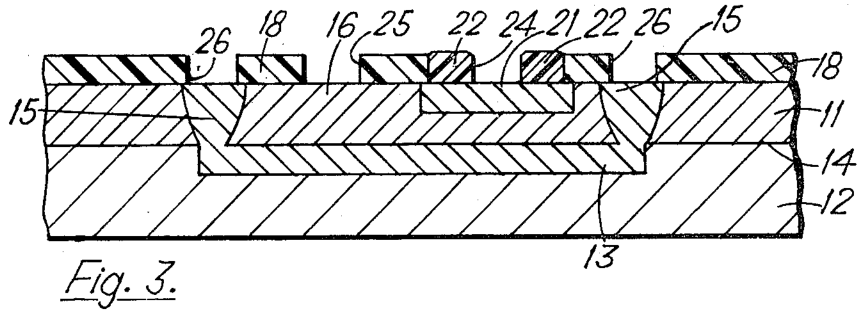

Apertures 24, 25 and 26, shown in FIG. 3, and for, respectively, emitter, base and collector contacts 27, 28 and 29, shown in FIG. 4, are formed through the silicon oxide layers 18 and 22. In order to facilitate the provision of the apertures 24, 25 and 26, and without adversely affecting the surface 17 of the epitaxial layer 11, it is desirable to form the apertures by simultaneously etching the appropriate parts of the silicon oxide layers 18 and 22 to expose simultaneously the three contact regions of the surface 17, the etching step being terminated before either the surface 17 is affected, or the silicon oxide layers 18 and 22 are undercut. Hence, the thickness of the silicon oxide layer 22 in relation to the thickness of the original silicon oxide layer 18 is arranged to be such that this criterion is obtained. The thickness of the layers 18 and 22 for this purpose may not be able to be substantially the same, although they are in the method described above.

A previously known way of forming the apertures 24, 25 and 26 for the contacts 27, 28 and 29 of a collector-diffusion-isolation transistor comprises pyrolytically depositing silicon oxide in the apertures 19 and 20, and over the original silicon oxide layer 18, from an atmosphere containing silane. Thus, the thickness of the silicon oxide layer 18 is substantially doubled. Initially, the aperture 25 to be formed through the layer 18 is half formed by a known method employing photolithographic techniques. Subsequently, the aperture 25 is completed, and simultaneously the apertures 24 and 26 through the deposited silicon oxide layer are formed, by repeating the photolithographic etching step. In contrast, with the method of growing silicon oxide in a steam treatment according to the present invention, and as described above, there is obviated the need to deposit silicon oxide pyrolytically, and the need for one of the two photolithographic etching steps, when forming the apertures 24, 25 and 26 in the silicon oxide layers 18 and 22. This simplification in the method of manufacturing the device 10 causes the manufacturing yield to be increased. In addition, the silicon oxide grown by the method according to the present invention is less prone to have pin-holes then pyrolytically deposited silicone oxide, ensuring that there is a reduced propensity of current leakage under normally encountered operating conditions for the device. Further, the original silicon oxide layer 18 is heavily doped with phosphorus and so assists in providing for a stable device.

In addition, there are no appreciable steps in thickness between the different silicon oxide layers 18 and 22, facilitating the provision of conductors extending on both passivating layers.

In FIGS. 3 and 4 the whole of the silicon oxide layer formed by the steam treatment on the collector is shown as being removed when forming the aperture 26 for the collector contact. However, some of the silicon oxide formed by the steam treatment may remain on the collector. There will not be a sharp step in thickness between the silicon oxide layer formed by the steam treatment on the collector and the original silicon oxide layer, because lateral diffusion of phosphorus from the collector ensures that there is a graduated enhanced growth rate of silicon oxide in the steam treatment on either side of the collector.

Further, the collector-diffusion-isolation transistor referred to above has a higher current gain value at low currents than would otherwise be the case.

Thus, the method of forming a passivating silicon oxide layer according to the present invention is particularly advantageous when employed in the manufacture of collector-diffusion-isolation transistors, and devices closely resembling the construction of such transistors. Such devices may conveniently be provided with original silicon oxide layers less than 3000 A thick.

In addition, the formation of the passivating layer on the emitter by the steam treatment does not cause a depletion of the concentration of the phosphorus at the active part of the emitter within the bulk of the epitaxial layer.

However, it is not essential that the device has such a construction, nor that the silicon oxide passivating layers should have substantially the same thickness as each other.

The method of forming a silicon oxide layer according to the present invention is useful also for manufacturing semiconductor devices in which the original silicon oxide layer has a thickness greater than the low value 3000 A. In such devices, there will be steps between the thicknesses of the original silicon oxide layer and the passivating layer formed by the steam treatment. However, such a device is possibly advantageous, perhaps being made with fewer processing steps than has been employed heretofor, and/or the P-N junctions of the device being well passivated, and/or the device having low current leakage and being reliable in operation.

It is advantageous, but not essential, that the silicon oxide formed on a region of the semiconductor body by the steam treatment is provided in an aperture of an original silicon oxide layer, and that it is provided after the final diffusion step in forming the semiconductor device. The final diffusion step may not comprise the diffusion of phosphorus into the selected region of the silicon body.

It is desirable that the temperature of the steam treatment is as low as possible. The growth rate of the silicon oxide layer by the steam treatment is proportional both to the temperature and the concentration of the phosphorus in the surface portions of the region. Hence, if it is required to have the thicknesses of the original silicon oxide layer and the layer provided by the steam treatment substantially the same, it may be required that the surface portions of the region should be heavily doped with phosphorus, for example, when a low steam treatment temperature is employed.

Conveniently, a silicon oxide layer, of any required thickness, may be provided if the temperature of the steam treatment is in the low range of 700° C to 1100° C, without there being a significant change in the impurity concentration gradients within the semiconductor body. Otherwise a thin silicon oxide layer may be provided by the method according to the present invention, with the enhanced growth rate, and there will not be a significant change in the impurity concentration gradients within the semiconductor body caused by its formation.

The silicon oxide layer provided by the steam treatment of the surface of a phosphorus doped region may be other than for passivation purposes.

What I claim is:

1. An improved method of manufacturing a semiconductor device of the collector-diffusion-isolation type in a semiconductor body comprises the steps of providing a substrate of P conductivity type, forming at least one heavily doped region of N conductivity type adjacent to a selected part of one surface of the substrate, depositing on said surface an extrinisic epitaxial layer of said P conductivity type thereby burying said heavily doped region at the interface of said substrate and said epitaxial layer, forming an isolation barrier of said N conductivity type extending through said epitaxial layer and in contact with the heavily doped buried region, depositing a first silicon oxide layer on the whole of the exposed surface of the epitaxial layer, selectively removing portions of the silicon oxide layer to expose at least one selected region of the epitaxial layer, selectively doping selected regions with phosphorus to form a heavily doped region of said N conductivity type and characterized by the improvement of limiting the deposition of the first silicon oxide layer to form a first oxide layer having thickness less than 3000A thick, subjecting the doped selected regions to steam oxidation to provide a second oxide layer without causing a significant change in the impurity concentration gradients within the semiconductor body wherein the thickness of the silicon oxide layer formed by steam oxidation of the doped regions provides a smoothly graded thickness between the first and the second silicon oxide layers and simultaneously etching apertures through the first and the second silicon oxide layers to expose surface regions of the epitaxial layer.

2. Am improved method of manufacturing a semiconductor device as set forth in claim 1 wherein the thickness of the silicon oxide layer formed by steam oxidation of the doped regions is substantially the same as the thickness of the first silicon oxide layer provided on the exposed surface of the epitaxial layer.

3. A method of manufacturing a semiconductor device as set forth in claim 1 wherein the temperature of the steam treatment is in the range of 700°C to 1100°C.

4. An improved method of manufacturing a semiconductor device as set forth in claim 1 wherein said heavily doped buried region and said isolation barrier are of the N+ type thereby defining a base of a transistor within the epitaxial layer, said heavily doped buried region and isolation barrier defining the collector of the transistor and said selectively doped regions defining an emitter of the transistor and further including the step of forming contacts in the apertures for the emitter, base and collector of the transistor.

5. An improved method of manufacturing a semiconductor device of the collector-diffusion-isolation type in a semiconductor body comprises the steps of providing a substrate of P conductivity type, forming a heavily doped region of N conductivity type adjacent to a selected part of one surface of the substrate, depositing on said surface an extrinsic epitaxial layer of said P conductivity type thereby burying said heavily doped region at the interface of said substrate and said epitaxial layer, forming an isolation barrier of said N conductivity type extending through said epitaxial layer and in contact with the heavily doped buried region, doping the whole of the exposed surface of the epitaxial layer by non-selective diffusion of a P type conductivity material, depositing a first silicon oxide layer on the whole of the exposed surface of the epitaxial layer, selectively removing portions of the silicon oxide layer to expose at least one selected region of the surface of the epitaxial layer, selectively doping the selected regions with phosphorus to form heavily doped regions of said N conductivity type and characterized by the improvement of limiting the deposition of the first silicon oxide layer to form a first oxide layer having thickness less than 3000A thick and subjecting the doped selected regions to steam oxidation to provide a second oxide layer without causing a significant change in the impurity concentration gradients within the semiconductor body wherein the thickness of the silicon oxide layer formed by steam oxidation of the doped regions provides a smoothly graded thickness between the first and the second silicon oxide layers and simultaneously etching apertures through both said first and said second silicon oxide layer.

6. An improved method of manufacturing a semiconductor device as set forth in claim 5 wherein the thickness of the silicon oxide layer formed by steam oxidation of the doped regions is substantially the same as the thickness of the first silicon oxide layer provided on the exposed surface of the epitaxial layer.

7. A method of manufacturing a semiconductor device as set forth in claim 5 wherein the temperature of the steam treatment is in the range of 700°C to 1100°C.

8. An improved method of manufacturing a semiconductor device as set forth in claim 5 wherein said heavily doped buried region and said isolation barrier are of the N+ type thereby defining a base of a transistor within the epitaxial layer, said heavily doped buried region and isolation barrier defining the collector of the transistor and said selectively doped regions defining an emitter of the transistor and further including the step of forming contacts in the apertures for the emitter, base and collector of the transistor.

* * * * *

UNITED STATES PATENT OFFICE

CERTIFICATE OF CORRECTION

PATENT NO. : 3,886,004

DATED : May 27, 1975

INVENTOR(S) : Jeffrey Alan Bruchez

It is certified that error appears in the above-identified patent and that said Letters Patent are hereby corrected as shown below:

Cover page, after item [21] insert:
--[30] Foreign Application Priority Data
March 4, 1972 Great Britain 10198/72--.

Signed and Sealed this

*sixteenth* Day of *December 1975*

[SEAL]

*Attest:*

RUTH C. MASON
*Attesting Officer*

C. MARSHALL DANN
*Commissioner of Patents and Trademarks*